United States Patent [19]

Pungas et al.

[11] 4,176,393

[45] Nov. 27, 1979

[54] A.C. TO D.C. VOLTAGE CONVERTER

[76] Inventors: Toom A. Pungas, Syspruse bulvar, 219, kv. 3; Tynis A. Laud, ulitsa Mustamyae, 147, kv. 198; Kheino A. Reinberg, ulitsa Akademia, 60, kv. 16; Raul-Vello P. Rebane, ulitsa Mustamyae, 181, kv. 137; Toomas R. Lumi, ultisa Komeedi, 15, kv. 3, all of Tallin, U.S.S.R.

[21] Appl. No.: 839,349

[22] Filed: Oct. 4, 1977

[51] Int. Cl.² ............................................. H02M 7/02
[52] U.S. Cl. ................................... 363/125; 324/119;
324/123 R
[58] Field of Search ................. 307/261; 324/119, 120,
324/123; 328/26; 363/125, 126

[56] References Cited

U.S. PATENT DOCUMENTS

| | | | |
|---|---|---|---|
| 3,196,291 | 7/1965 | Woodward, Jr. | 307/261 X |
| 3,287,651 | 11/1966 | Ingle | 324/123 R X |
| 3,311,826 | 3/1967 | Galman | 324/123 R |
| 3,553,566 | 1/1971 | Nagy, Jr. | 324/119 X |

FOREIGN PATENT DOCUMENTS 2428035  1/1976  Fed. Rep. of Germany ...... 324/123 R

OTHER PUBLICATIONS

Electronics, "Op Amps From Self-Buffered Rectifier", Jerald Graeme, vol. 43, No. 21, p. 98, Oct. 12, 1970.

Primary Examiner—William M. Shoop
Attorney, Agent, or Firm—Lackenbach, Lilling & Siegel

[57] ABSTRACT

An a.c. to d.c. voltage converter of this invention comprises an a.c. voltage amplifier whose inverting input is connected to a lead of an input resistor, and whose non-inverting input is grounded for alternating current. The converter further includes a non-linear detection unit having a separating capacitor, a diode with one electrode connected via the separating capacitor to the output of the a.c. voltage amplifier and the other electrode connected to the inverting input of the a.c. voltage amplifier, and a means for producing direct linear current through the input resistor connected in parallel with the diode and electrically coupled to the input of the converter. The a.c. to d.c. voltage converter of this invention provides for automatic filtering of detected signals and insures excellent time stability of the conversion coefficient.

9 Claims, 41 Drawing Figures

A.C. TO D.C. VOLTAGE CONVERTER

FIELD OF THE INVENTION

The present invention relates to measuring equipment and, more particularly, to a.c. to d.c. voltage converters.

The invention can be used to advantage in converters to be employed in multimeters, comparators of a.c. calibrators, voltmeters, and household radio equipment, for example, detectors of broadcast receivers.

BACKGROUND OF THE INVENTION

At present, considerable effort in the field of measuring instruments has gone into the automation of measurements done with the aid of d.c. digital voltmeters. The functional potentialities of such voltmeters are expanded due to the use of special converters. Stringent requirements are imposed on such converters as concerns accuracy, time stability, linearity and operating speed. When converting a.c. voltage to d.c. voltage, prescribed characteristics are maintained with the aid of a special amplifier with a detecting unit in its feedback path, which detecting unit is intended for linearization of the volt-ampere characteristic of said amplifier. Detected pulsating voltage is normally smoothed with the aid of a quite sophisticated low-frequency filter. In many types of a.c. to d.c. voltage converters, the filtering is done with the aid of different versions of active devices, such as averaging integrators, which possess a certain constant signal transmission coefficient and suppress the variable component of the signal being produced. The result is low capacitance of the capacitors employed in the converter at a low output resistance. However, drift occurs at the output of the converter, and there is an increase in the conversion error due to a change in the transmission coefficient of the integrating unit, which, in turn, is due to a changed ratio of the resistors placed in its feedback path.

DESCRIPTION OF THE PRIOR ART

There is known an a.c. to d.c. voltage converter (cf. U.S. Pat. No. 3,311,826) comprising an a.c. voltage amplifier whose inverting input is connected to an output terminal of an input resistor and whose non-inverting input is grounded for alternating current. The converter further includes a non-linear detection unit incorporating a separating capacitor and a diode, whose first electrode is connected via the separating capacitor to the output of the a.c. voltage amplifier and whose second electrode is connected to the inverting input of said a.c. voltage amplifier. The converter under review still further includes a measuring system for determining the average magnitude of the detected pulsating current, which is proportional to the a.c. voltage being measured, said measuring system being electrically coupled to the non-linear detection unit. The measuring system largely accounts for the filtering of the detected pulsating current due to its own inertia.

However, there is no smoothed constant signal at the output of the a.c. to d.c. voltage converter under review.

Besides, additional filters are required for the conversion of low-frequency variable signals.

In the above converter, the conversion coefficient is determined by the ratio between the load resistance and the resistance of the input resistor; any variation in this ratio leads to an increased error and affects the stability of conversion.

SUMMARY OF THE INVENTION

It is an object of the present invention to simplify the circuitry of the a.c. to d.c. voltage converter.

It is another object of the invention to provide for automatic filtering of detected voltage.

It is still another object of the invention to improve the stability and accuracy of a.c. to d.c. voltage conversion.

It is yet another object of the invention to increase the operating speed of the a.c. to d.c. voltage converter.

The foregoing objects are attained by providing an a.c. to d.c. voltage converter comprising an a.c. voltage amplifier whose inverting input is connected to an output terminal of an input resistor and whose non-inverting input is grounded for alternating current. The a.c. to d.c. voltage converter also includes a non-linear detection unit having a separating capacitor and a diode, whose first electrode is connected via the separating capacitor to the output of the a.c. voltage amplifier and whose second electrode is connected to the inverting input of the a.c. voltage amplifier. According to the invention, by that the non-linear detection unit additionally includes a means for producing direct linear current in the input resistor, which is placed in parallel with the diode and is electrically coupled to the converter's input.

It is preferable that the means for producing direct linear current through the input resistor should include a switch whose input is connected to the point of connection of the diode and the separating capacitor, a resistor with one of its leads being connected to the output of the switch, and a means for effecting a drop of voltage of the same polarity as the direct current through the input resistor, one of its leads being connected to the output of the switch and its other lead being connected to the inverting input of the a.c. voltage amplifier.

It is preferable that the means for effecting a drop of voltage of the same polarity as the direct current through the input resistor should be a capacitor.

It is also preferable that the means for effecting a drop of voltage of the same polarity as the direct current through the input resistor should be a resistor.

It is preferable that the second lead of the resistor of the means for producing direct linear current through the input resistor should be grounded.

It is preferable that the second lead of the resistor of the means for producing direct linear current through the input resistor should be connected to the second lead of the input resistor.

It is preferable that the means for producing direct linear current through the input resistor should additionally contain an operational amplifier whose inverting input is connected to the output of the switch, whose non-inverting input is connected to the inverting input of the a.c. voltage amplifier, and whose output is connected to the second lead of the resistor.

According to the present invention, the means for producing direct linear current through the input resistor of the non-linear detection unit makes it possible to produce a constant output voltage at the input resistor, which is linearly related to the voltage being converted. The result is a great improvement in the accuracy and time stability of the converter, as well as a simpler circuitry, and a higher operating speed and reliability of said converter.

In addition, the converter of the present invention operates in the full-wave mode, which improves the transmission coefficient and noise immunity of the converter.

BRIEF DESCRIPTION OF THE DRAWINGS

Other objects and advantages of the present invention will become more apparent from the following detailed description of preferred embodiments thereof to be read in conjunction with the accompanying drawings, wherein.

DETAILED DESCRIPTION OF THE INVENTION

Turning now to the attached drawings, the proposed a.c. to d.c. voltage converter comprises an a.c. voltage amplifier 1 (FIG. 1) whose inverting input 2 is connected to a lead of an input resistor 3 at a point of connection or node 4. The second lead of the resistor 3 is connected to an input terminal 5. A second input terminal 6 and a non-inverting input 7 of the amplifier 1 are grounded. An output 8 of the amplifier 1 is connected to a lead of a separating capacitor 9 of a non-linear detection unit 10. The unit 10 also contains a main diode 11, one of whose electrodes is connected to the second lead of the separating capacitor 9 at a point of connection or node 12. The second electrode of the diode 11 is connected to the point of connection 4. The unit 10 includes a producing means 13 for producing direct linear current through the input resistor 3, which is placed in parallel with the diode 11. An output terminal 14 is connected to the point of connection 4.

According to one particular embodiment of the present invention, the means 13 (FIG. 2) for producing direct linear current through the input resistor 3 comprises a switch whose function is performed by a diode 15. One electrode of the diode 15 is connected to the point of connection 12. The means 13 also includes a resistor 16, one of whose leads is grounded, and a voltage drop means for producing a drop of voltage of the same polarity as the direct current through the input resistor 3, which means is a capacitor 17. One lead of the capacitor 17 is connected to the point of connection 4. The second leads of the capacitor 17 and the resistor 16 and the second electrode of the diode 15 are interconnected at a point of connection or node 18.

According to another embodiment of the invention, the means 13 (FIG. 3) for producing direct linear current through the input capacitor 3 includes a resistor 19 which serves as the means for effecting a drop of voltage of the same polarity as the direct current through the input resistor 3. One lead of the resistor 19 is connected to the point of connection 4 and the second lead is connected to the point of connection 18.

Figure 2:
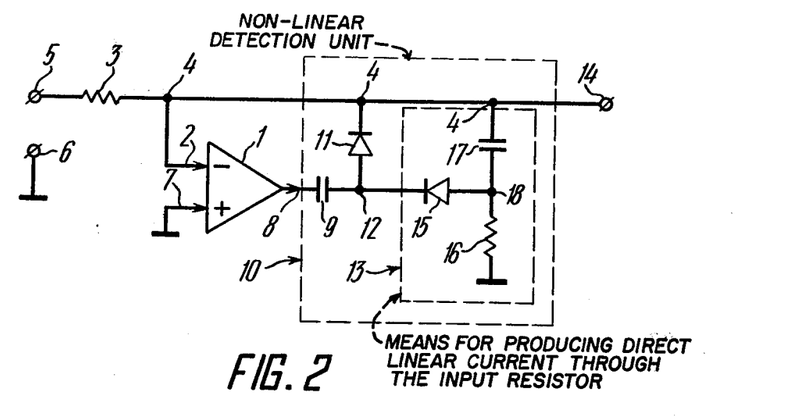
FIG. 2 is an electrical, schematic diagram of an a.c. to d.c. voltage converter, in accordance with the invention, wherein the means for effecting a drop of voltage of the same polarity as the direct current through the input resistor is a capacitor.
Figure 4:
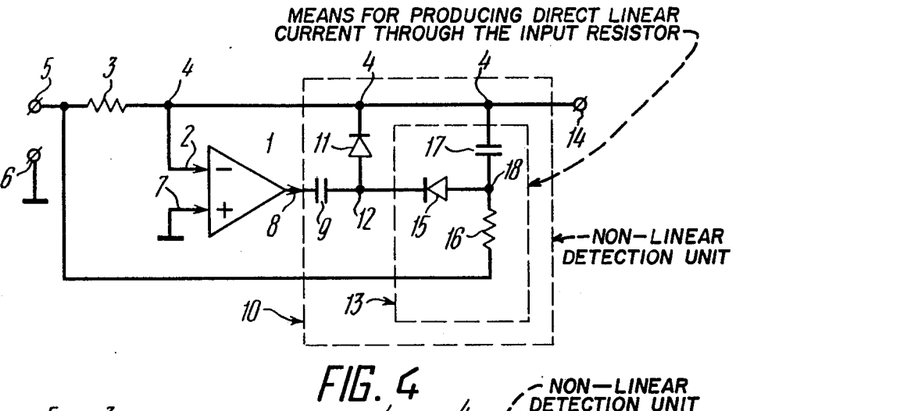
FIG. 4 is an electrical, schematic of an a.c. to d.c. voltage converter, in accordance with the invention, wherein the resistor is connected to the input of the converter, and the means for effecting a drop of voltage of the same polarity as the direct current through the input resistor is a capacitor.

According to an embodiment of the invention, shown in FIG. 2, the means 13 (FIG. 4) for producing direct linear current through the input resistor 3 has an arrangement such that one lead of the resistor 16 is connected to the point of connection 18 and its second lead is connected to the input terminal 5.

Figure 3:
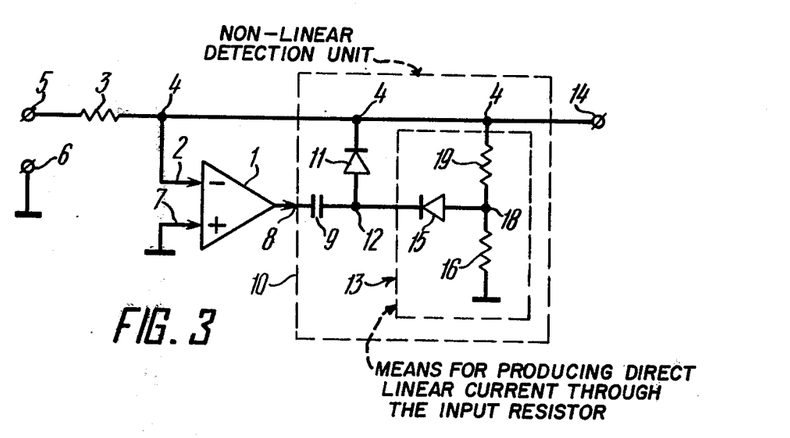
FIG. 3 is an electrical, schematic of an a.c. to d.c. voltage converter, in accordance with the invention, wherein the means for effecting a drop of voltage of the same polarity as the direct current through the input resistor is a resistor.

According to another embodiment of the invention shown in FIG. 3, the means 13 (FIG. 5) for producing direct linear current through the input resistor 3 has an arrangement such that one lead of the resistor 16 is connected to the point of connection 18 and its other lead is connected to the input terminal 5.

According to a further embodiment of the proposed a.c. to d.c. voltage converter, the means 13 (FIG. 6) for producing direct linear current through the input resistor 3 additionally includes an operational amplifier 20 whose inverting input 21 is connected to the point of connection 18, whose non-inverting input 22 is connected to the point of connection 4, and whose output 23 is connected to one of the leads of the resistor 16 whose second lead is connected to the point of connection 18. An output terminal 24 of the converter's low-resistance output is connected to the point of connection 18.

The proposed a.c. to d.c. voltage converter operates as follows.

A.c. voltage, which is applied to the input terminals 5 and 6 (FIG. 1), produces alternating current in the input resistor 3, whose magnitude is equal to the ratio between the magnitude of the a.c. voltage and the resistance of the input resistor 3; it should be borne in mind that the amplifier 1 has a negative a.c. feedback path, so the magnitude of the a.c. voltage across the inverting input 2 of the amplifier 1 is negligibly small. For that reason, instead of flowing to the inverting input 2 of the amplifier 1, the alternating current produced in the resistor 3 is directed through the non-linear detection unit 10 to the output 8 of the amplifier 1. Generally, current of one polarity flows through the main diode 11, whereas current of the opposite polarity flows through the means 13 for producing direct linear current in the input resistor 3. Apart from the alternating current, the means 13 also produces direct current through the input resistor 3, whose magnitude is linearly dependent upon the magnitude of the a.c. input current; thus the magnitude of this direct current is linearly dependent upon the magnitude of the a.c. voltage being converted.

Figure 1:
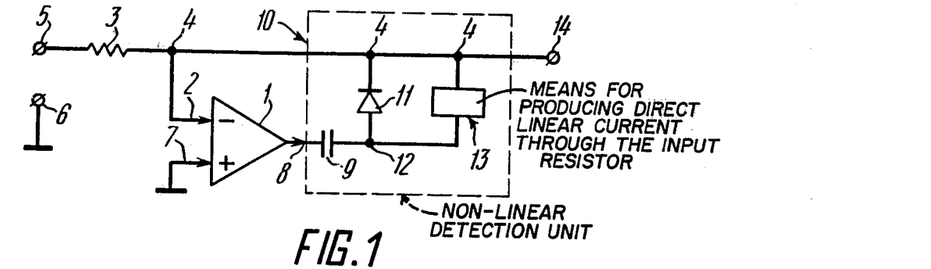
FIG. 1 is an electrical schematic diagram of an a.c. to d.c. voltage converter in accordance with the invention.

Let it be assumed that the signal source (not shown) connected to the input of the converter has a small internal resistance to alternating current, as compared to the resistance of the resistor 3; hence, the direct current of the input resistor 3 flows through the internal resistance of the source to the ground and at the input 2 of the amplifier 1 there is produced an a.c. voltage whose magnitude is equal to the voltage drop across the input resistor 3. According to the invention, this current accounts for a situation where the conversion coefficient is independent of a specific resistance value of the input resistor 3. The d.c. voltage thus produced, which is linearly dependent upon the magnitude of the a.c. voltage being converted, is directly applied to the output terminal 14 of the converter.

The a.c. voltage at the terminal 14 can be neglected because, according to the invention, this voltage is the input a.c. voltage of the amplifier 1 having negative a.c. feedback path.

Consider now the proposed a.c. to d.c. voltage converter, wherein the means 13 (FIG. 2) for producing direct linear current through the input resistor 3 includes the capacitor 17 which performs the function of the means for producing a drop of voltage of the same polarity as the direct current through the input resistor 3. The converter under review is a half-wave rectified a.c. to d.c. voltage converter which operates as follows.

Figure 7A:
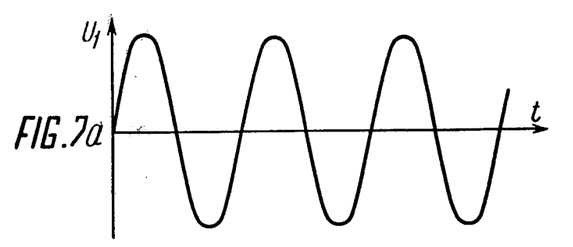
FIGS. 7a, b, c, d, e, f, g are time plots related to FIGS. 2 and 6.
Figure 7B:
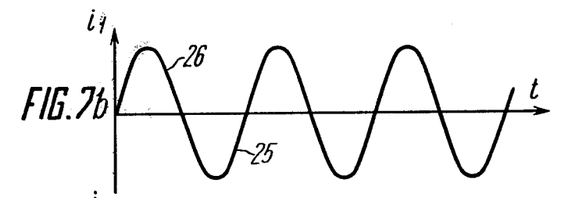
Figure 7C:
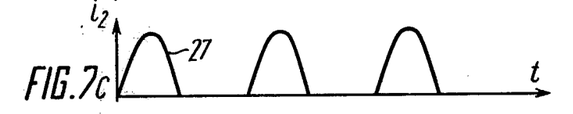
Figure 7D:
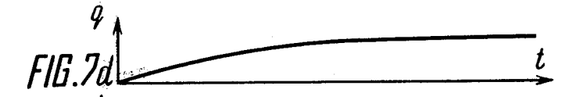
Figure 7E:
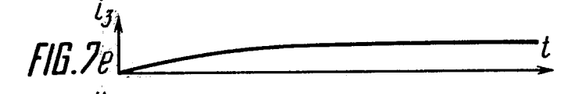
Figure 7F:
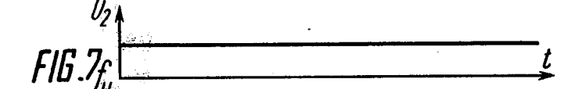
Figure 7G:
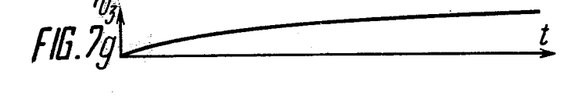

A.c. voltage $U_1$ to be converted, illustrated in FIG. 7a, produces alternating current $i_1$, represented in FIG. 7b, through the input resistor 3. A negative half period 25 of the alternating current $i_1$, represented in FIG. 7b, is applied via the main diode 11 (FIG. 2) and the separating capacitor 9 to the output 8 of the amplifier 1; a positive half period 26, represented in FIG. 7b, is applied, according to the invention, at the output 8 of the amplifier 1 via the capacitor 17, diode 15 and capacitor 9. During the positive half period 26 (FIG. 7b), pulses 27, represented in FIG. 7c, of rectified current $i_2$ charge the capacitor 17. A charge q, represented in FIG. 7d, of the capacitor 17 (FIG. 2) increases, according to the invention, until direct discharge current $i_3$, represented in FIG. 7e, flowing through the input resistor 3 (FIG. 2), is equal to the mean value of the charging pulses 27 (FIG. 7e). The mean value of the pulses 27 is proportional to the mean value of the half wave rectified voltage $U_2$ being converted, which is represented in FIG. 7f. This means that the a.c. voltage $U_3$, represented in FIG. 7g and produced, according to the invention, at the input 2 (FIG. 2) of the amplifier 1 and applied to the output terminal 14, is equal to the mean value of the half-wave rectified voltage $U_2$ (FIG. 7f) being converted and is independent of the resistance of the resistor 3 (FIG. 2). The resistor 16 is grounded and thus connected to the input of the converter, i.e. the input terminal 6, so as to charge the capacitor 17 through the internal resistance of the signal source.

The proposed a.c. to d.c. voltage converter can operate as a full-wave a.c. to d.c. voltage converter if the resistor 16 (FIG. 4) is connected to the input of the converter, i.e. the terminal 5, and thus makes it possible for the capacitor 17 to discharge without a signal source. In this case, as in the case of the half-wave converter shown in FIG. 2, the capacity of the capacitor 17 (FIG. 4) is selected to be such that at the lowermost operating frequency the a.c. voltage drop across said capacitor 17 should be negligible.

Figure 8A:
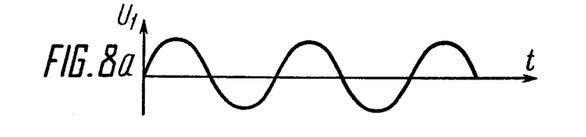
FIGS. 8a, b, c, d, e, f, g, h, i are time plots related to FIG. 4.

In this case, as in the case of the embodiment of FIG. 2, a.c. voltage at both plates of the capacitor 17 (FIG. 4) is close to zero. The a.c. voltage $U_1$ being converted, represented in FIG. 8a, is applied to the resistors 3 and 16 (FIG. 4) and produces therein alternating current $i_1$ represented in FIG. 8b. During a positive half period 28, represented in FIG. 8b, of alternating current $i_4$ (FIG. 8b) the diode 11 (FIG. 4) is non-conducting, whereas the diode 15 is driven into conduction so that during the positive half period 28 the current $i_4$ (FIG. 8b), applied via the resistor 3 (FIG. 4), the capacitor 17, the diode 15 and the separating capacitor 9 to the output 8 of the amplifier 1, charges the capacitor 17. During the positive half period 28, the current $i_4$ (FIG. 8b), applied to the output 8 (FIG. 4) of the amplifier 1 via the resistor 16, the diode 15 and the capacitor 9, does not change the charge of the capacitor 17.

Figure 8B:
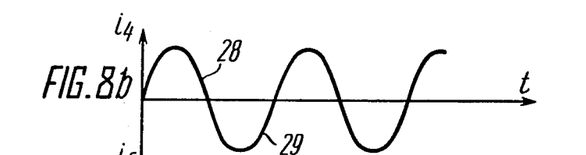
Figures 8C, 8D:
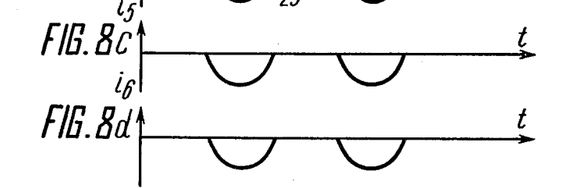

During a negative half period 29, represented in FIG. 8b, of the alternating current $i_1$, the diode 11 (FIG. 4) is driven into conduction, whereas the diode 15 is rendered non-conducting. During the negative half period 29 (FIG. 8b), the current $i_4$ applied from the output 8 (FIG. 4) of the amplifier 1 via the capacitor 9 and diode 11 is divided into two components, $i_5$ and $i_6$, represented in FIGS. 8c and 8d, respectively. The component $i_5$ is applied via the resistor 3 (FIG. 4) to the input terminal 5, whereas the component $i_6$ (FIG. 8d) is applied, in accordance with the invention, to the input terminal 5 (FIG. 4), via the capacitor 17 and resistor 16, and charges the capacitor 17.

Figure 8E:
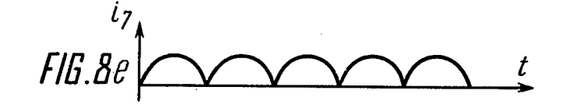
Figure 8F:
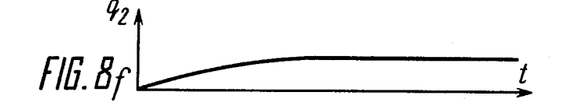
Figure 8G:
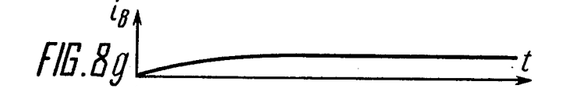

According to the invention, current $i_7$, which is represented in FIG. 8e and charges the capacitor 17 (FIG. 4), occurs during both half periods 28 and 29 (FIG. 8b) of the alternating current $i_1$. The charge $q_2$, represented in FIG. 8f, of the capacitor 17 (FIG. 4) increases until the direct discharge current $i_8$, represented in FIG. 8g, of the capacitor 17 (FIG. 4), which flows through the input resistor 3 and the resistor 16, is equal to the mean value of the current $i_7$ (FIG. 8e) which charges the capacitor 17.

Figure 8H:
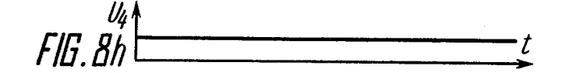
Figure 8I:
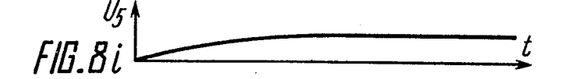

According to the invention, the mean value of the current $i_7$ is proportional to the mean value of the full-wave rectified voltage $U_1$ being converted, represented in FIG. 8h; hence, a.c. voltage $U_5$, represented in FIG. 8i and produced by the direct discharge current $i_8$ (FIG. 8g) of the capacitor 17 (FIG. 4), flowing through the input resistor 3 at the output 2 of the amplifier 1 and the output terminal 14, is proportional to the mean value of the fullwave rectified a.c. voltage $U_4$ (FIG. 8h) being converted.

Figure 6:
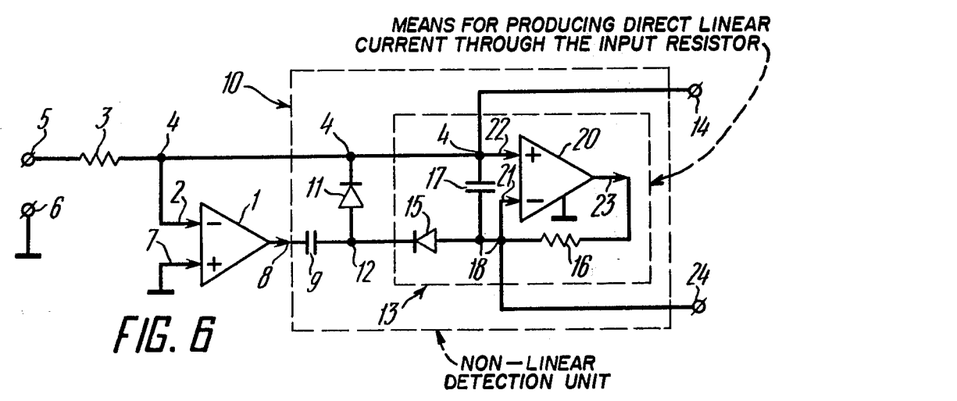
FIG. 6 is an electrical, schematic of the a.c. to d.c. voltage converter of FIG. 4, additionally including an operational amplifier, in accordance with the invention.

The operating speed of the converter operating in the half-wave mode (FIG. 2) can be increased if the means 13 for producing direct linear current through the input resistor 3 additionally includes the operational amplifier 20 (FIG. 6).

In this case, as in the case of the converter of FIG. 2, during the negative half period 25 (FIG. 7b) the current $i_1$ flows through the main diode 11 (FIG. 6) and the separating capacitor 9 to the output 8 of the amplifier 1; according to the invention, during the positive half period 26 (FIG. 7b) the current $i_1$ is applied to the output 8 (FIG. 6) of the amplifier 1 via the capacitor 17, the diode 15 and the capacitor 9. During the positive half period 26 (FIG. 7b) the pulses 27 (FIG. 7e) of the current $i_1$ tend to change the charge of the capacitor 17 (FIG. 6), but the amplifier 20 with its negative d.c.

feedback path produces d.c. voltage at the point of connection 18, which compensates for changes in the charge of the capacitor 17. The periodic action of the pulses 27 (FIG. 7c) of the current $i_1$ (FIG. 7b) increases the potential at both plates of the capacitor 17 (FIG. 6); at the output 23 of the amplifier 20 there appears current with the same characteristics as the current $i_3$ (FIG. 7e) of the capacitor 17 (FIG. 2), which flows through the resistor 16 (FIG. 6), the diodes 15 and 11, the resistor 3 and the internal resistance of the signal source to the ground. According to the invention, this current produces d.c. voltage across the input resistor 3, whose characteristics are similar to those of voltage $U_3$ (FIG. 7g); this voltage is applied to the output terminal 14 (FIG. 6) and is equal to the mean value of the half-wave rectified voltage $U_2$ (FIG. 7f) being converted.

D.c. voltage at the output terminal 24 (FIG. 6), connected to the point of connection 18, is equal to the d.c. voltage $U_3$ (FIG. 7g) at the output terminal 14 (FIG. 6) because the operational amplifier 20 operates as a voltage follower, for which reason the output resistance of the terminal 24 can be neglected. In such operating conditions of the converter, the capacitor 17 is not charged and there is an increase in the operating speed of the converter.

Figure 5:
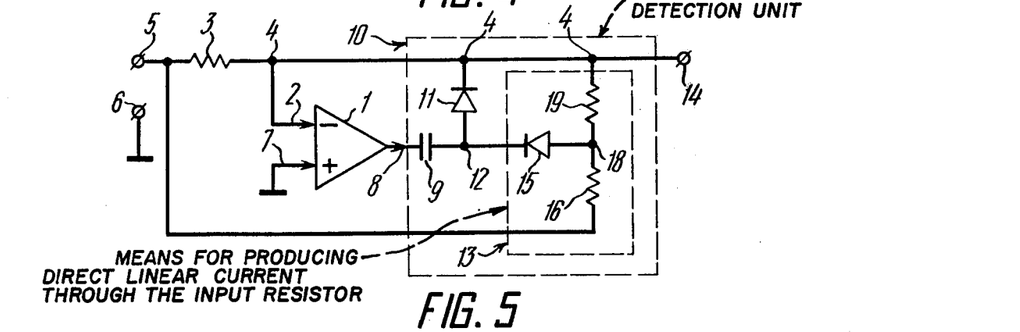
FIG. 5 is an electrical, schematic of an a.c. to d.c. voltage converter, in accordance with the invention, wherein the resistor is connected to the input of the converter, and the means for effecting a drop of voltage of the same polarity as the direct current through the input resistor is a resistor.

The converter's operating speed can also be increased, if in the means 13 for producing direct linear current through the input resistor 3, the function of the means for effecting a drop of voltage of the same polarity as the direct current through the input resistor 3 is performed by the resistor 19 (FIGS. 3 and 5).

If the resistor 16 (FIG. 3) is grounded, the converter operates as follows.

Figure 9A:
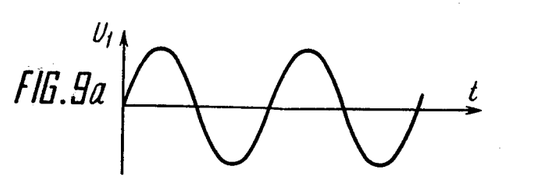
FIGS. 9a, b, c, d, e, f, g, h, i are time plots related to FIG. 3.
Figures 9B, 9C:
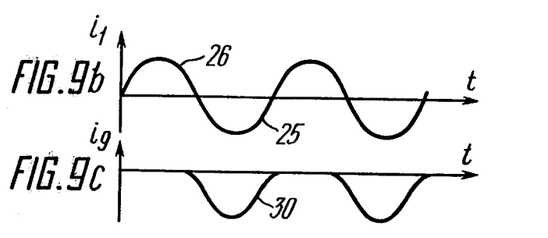
Figure 9D:
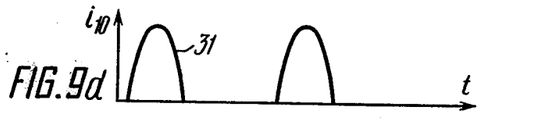
Figure 9E:
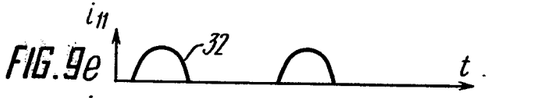
Figure 9F:
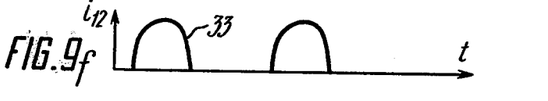
Figure 9G:
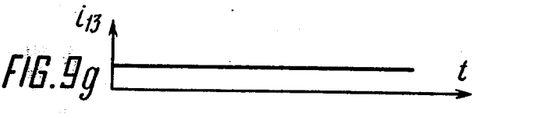
Figure 9H:
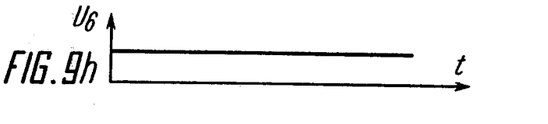

The a.c. voltage $U_1$ being converted, represented in FIG. 9a, produces alternating current $i_1$, represented in FIG. 9b, in the input resistor 3 (FIG. 3). In the steady-state conditions, the mean value of pulses 30, represented in FIG. 9c, of the current $i_9$, which pass through the diode 11 (FIG. 3), and of pulses 31, represented in FIG. 9d, of current $i_{10}$, which pass through the diode 15 (FIG. 3), are equal because no direct current flows through the capacitor 9. Each pulse 31 (FIG. 9d) of the current $i_{10}$ is a sum total of two pulses, i.e. a pulse 32, represented in FIG. 9e, of current $i_{11}$, and a pulse 33, represented in FIG. 9f, of current $i_{12}$. According to the invention, the pulses 32 (FIG. 9e) of the current $i_{11}$ pass through the resistor 19 (FIG. 3), whereas the pulses 33 (FIG. 9f) of the current $i_{12}$ pass through the resistor 16 (FIG. 3). The capacitor 9 is charged so that the diode 11 conducts for a longer period of time than the duration of the negative half period 25 (FIG. 9b) of the current $i_1$, in order to enable the capacitor 9 (FIG. 3) to balance to mean values of the current $i_9$ (FIG. 9c) and the current $i_{10}$ (FIG. 9f). The mean value of the current $i_1$ (FIG. 9b) is zero, while the mean value of the current $i_9$ (FIG. 9c) passing through the diode 11 (FIG. 3) is greater than the mean value of the pulse 32 (FIG. 9e) of the current $i_{11}$, passing through the resistor 19 (FIG. 3); as a result, there appears balancing direct current $i_{13}$ represented in FIG. 9g. The current $i_{13}$ flows through the input resistor 3 (FIG. 3) and the internal resistance of the signal source (not shown), as well as through the resistors 19 and 16 to the ground. Under the action of the current $i_{13}$ (FIG. 9h), at the point of connection 4 there a produced d.c. voltage $U_6$ represented in FIG. 9h, which is applied to the output terminal 14 (FIG. 3) of the converter.

With a certain voltage $U_1$ (FIG. 9a) being converted, the magnitude of the d.c. voltage $U_6$ (FIG. 9i) is dependent upon the ratio between the resistances of the resistors 3, 16 and 19 (FIG. 3). Under the foregoing operating conditions, none of the components of the means 13 for producing direct linear current through the input resistor 3 is inert, which also accounts for an increased operating speed of the converter in accordance with the invention.

When the resistor 16 (FIG. 5) is connected to the input terminal 5, the proposed a.c. to d.c. voltage converter operates as a full-wave a.c. to d.c. voltage converter.

Figure 10A:
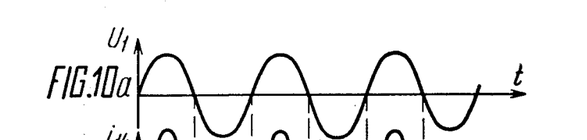
FIGS. 10a, b, c, d, e, f, g, h, i, j are time plots related to FIG. 5.
Figure 10B:
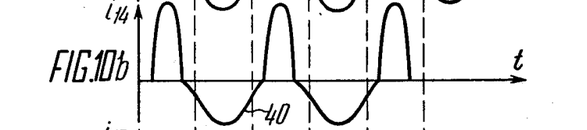

A.c. voltage $U_1$ being converted, represented in FIG. 10a, produces alternating current $i_1$ represented in FIG. 10b.

Figure 10C:
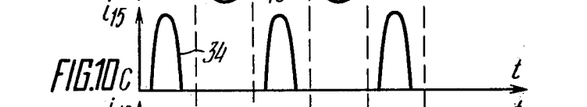
Figures 10D, 10E:
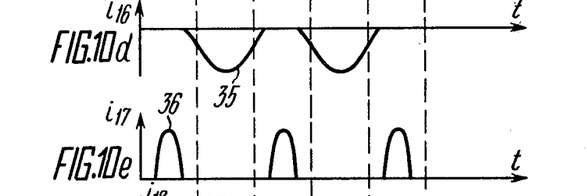

In this case, as in the case of the half-wave converter shown in FIG. 3, the mean values of pulses 34, represented in FIG. 10c, of current $i_{15}$, which pass through the diode 11 (FIG. 5), and of pulses 35, represented in FIG. 10d, of current $i_{16}$, which pass through the diode 15 (FIG. 5), are equal.

Figures 10F, 10G:
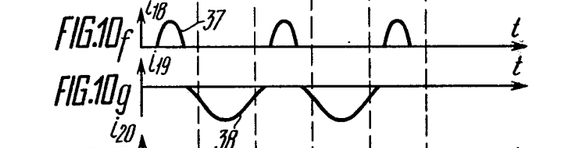

Each pulse 34 (FIG. 10c) of the current $i_{15}$ is a sum total of two pulses, i.e. a pulse 36, represented in FIG. 10c, of current $i_{18}$, and a pulse 37, represented in FIG. 10f, of current $i_{19}$. According to the invention, the pulses 36 (FIG. 10e) of the current $i_{18}$ pass through the resistor 19 (FIG. 5), whereas the pulses 37 (FIG. 10f) of the current $i_{19}$ pass through the resistor 16 (FIG. 5).

Figures 10H, 10I:
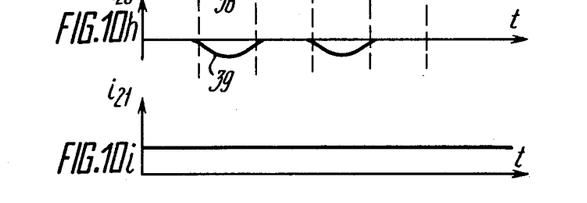

Each pulse 35 (FIG. 10d) of the current $i_{16}$ is a sum total of two pulses, i.e. a pulse 38, represented in FIG. 10g, of current $i_{19}$, and a pulse 39, represented in FIG. 10h, of current $i_{20}$. According to the invention, the pulses 38 (FIG. 10g) of the current $i_{19}$ pass through the resistor 3 (FIG. 5), whereas the pulses 39 (FIG. 10h) of the current $i_{20}$ pass through the resistors 16 and 19 (FIG. 5). In order to achieve a balance between the mean values of the currents $i_{15}$ (FIG. 10c) and $i_{16}$ (FIG. 10d) in the capacitor 9 (FIG. 5), the capacitor 9 is charged so that the diode 11 is in the conducting state for a longer period of time than the duration of a negative half period 40, represented in FIG. 10b, of the current $i_{14}$, the duration of the negative half period 40 being equal to that of the pulse 35 (FIG. 10d).

Figure 10J:
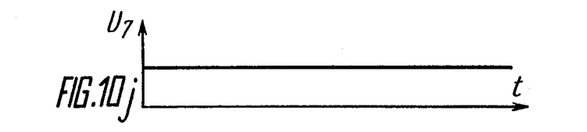

The current $i_{17}$ (FIG. 10e) flows from the capacitor 9 (FIG. 5) directly to the input terminal 5, bypassing the point of connection 4; as a result, a balancing direct current $i_{21}$, represented in FIG. 10i, appears. The current $i_{21}$ flows through the input resistor 3 (FIG. 5) and produces a.c. voltage $U_7$ at the point of connection 4, which is represented in FIG. 10j and applied to the output terminal 14 (FIG. 5) of the converter.

In this case, as in the case of the half-wave converter of FIG. 3, the value of the a.c. voltage $U_7$ (FIG. 10i) is determined by the ratio between the resistances of the resistors 3, 16 and 19 (FIG. 5). Under such operating conditions, none of the components of the means 13 for producing direct linear current through the input resistor 3 is inert, which also accounts for an increased operating speed of the converter.

The present invention makes it possible to automatically filter voltage which is being converted.

In addition, the invention makes it possible to reduce the amount of expensive precision components to be incorporated in the a.c. to d.c. voltage converter.

What is claimed is:

1. An a.c. to d.c. voltage converter comprising:

an a.c. voltage amplifier having an inverting input, a non-inverting input connected to ground, and an output;

an input resistor having a first lead connected to said inverting input of said a.c. voltage amplifier, and a second lead connected to a first input of said converter;

a separating capacitor having a first lead connected to said output of said a.c. voltage amplifier, and a second lead;

a diode having a first electrode connected to said first lead of said input resistor, and a second electrode connected to said second lead of said separating capacitor; and a means for producing direct linear current through said input resistor electrically coupled to the input of said a.c. to d.c. voltage converter and placed in parallel with said diode.

2. An a.c. to d.c. voltage converter comprising:

an a.c. voltage amplifier having an inverting input, a non-inverting input connected to ground, and an output;

an input resistor having a first lead connected to said inverting input of said a.c. voltage amplifier, and a second lead connected to a first input of said converter;

a separating capacitor having a first lead connected to said output of said a.c. voltage amplifier, and a second lead;

a diode having a first electrode connected to said first lead of said input resistor, and a second electrode connected to said second lead of said separating capacitor; and a means for producing direct linear current through said input resistor electrically coupled to the input of said a.c. to d.c. voltage converter and placed in parallel with said diode, wherein said means for producing direct linear current through said input resistor comprises: a switch having an input connected to said second electrode of said diode and to said second lead of said separating capacitor, and an output; a resistor having a first lead connected to said output of said switch, and a second lead; and a means for producing a drop of voltage of the same polarity as the direct current through said input resistor having a first lead connected to said output of said switch, and a second lead connected to said inverting input of said a.c. voltage amplifier.

3. An a.c. to d.c. voltage converter as claimed in claim 2, wherein said means for producing a drop of voltage of the same polarity as the direct current through said input resistor is a capacitor.

4. An a.c. to d.c. voltage converter as claimed in claim 2, wherein said means for producing a drop of voltage of the same polarity as the direct current through said input resistor is a resistor.

5. An a.c. to d.c. voltage converter as claimed in claim 3, wherein said second lead of said resistor of said means for producing direct linear current through said input resistor is grounded.

6. An a.c. to d.c. voltage converter as claimed in claim 3, wherein said second lead of said resistor of said means for producing direct linear current through said input resistor is connected to said second lead of said input resistor.

7. An a.c. to d.c. voltage converter as claimed in claim 3, wherein said means for producing direct linear current through said input resistor further includes an operational amplifier having an inverting input connected to said output of said switch, a non-inverting input connected to said inverting input of said a.c. voltage amplifier, and an output connected to said second lead of said resistor.

8. An a.c. to d.c. voltage converter as claimed in claim 4, wherein said second lead of said resistor of said means for producing direct linear current through said input resistor is grounded.

9. An a.c. to d.c. voltage converter as claimed in claim 4, wherein said second lead of said resistor of said means for producing direct linear current through said input resistor is connected to said second lead of said input resistor.

* * * * *